United States Patent
Ogawa

(10) Patent No.: US 12,034,426 B2
(45) Date of Patent: Jul. 9, 2024

(54) MULTILAYER FILTER

(71) Applicant: Murata Manufacturing Co., Ltd., Nagaokakyo (JP)

(72) Inventor: Keisuke Ogawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 203 days.

(21) Appl. No.: 17/715,995

(22) Filed: Apr. 8, 2022

(65) Prior Publication Data

US 2022/0231655 A1 Jul. 21, 2022

Related U.S. Application Data

(63) Continuation of application No. PCT/JP2020/040084, filed on Oct. 26, 2020.

(30) Foreign Application Priority Data

Dec. 3, 2019 (JP) ................. 2019-218719

(51) Int. Cl.
*H03H 7/09* (2006.01)
*H03H 1/00* (2006.01)
*H03H 7/01* (2006.01)

(52) U.S. Cl.
CPC ............ *H03H 7/09* (2013.01); *H03H 7/1766* (2013.01); *H03H 2001/0057* (2013.01); *H03H 2001/0085* (2013.01)

(58) Field of Classification Search
CPC . H03H 2001/0085; H03H 7/09; H03H 7/0115
USPC ................................. 333/175, 185
See application file for complete search history.

(56) References Cited

U.S. PATENT DOCUMENTS

| | | |
|---|---|---|
| 2003/0048156 A1 | 3/2003 | Uriu et al. |
| 2007/0241839 A1 | 10/2007 | Taniguchi |
| 2013/0154769 A1 | 6/2013 | Masuda |
| 2017/0093359 A1 | 3/2017 | Shiokawa |
| 2019/0288659 A1 | 9/2019 | Oishi |
| 2020/0243254 A1 | 7/2020 | Imamura |

FOREIGN PATENT DOCUMENTS

| | | |
|---|---|---|
| JP | 2013-128232 A | 6/2013 |
| JP | 2017-069670 A | 4/2017 |
| WO | 02/09225 A1 | 1/2002 |
| WO | 2007/119356 A1 | 10/2007 |

(Continued)

OTHER PUBLICATIONS

Official Communication issued in International Patent Application No. PCT/JP2020/040084, mailed on Dec. 22, 2020.

*Primary Examiner* — Rakesh B Patel
(74) *Attorney, Agent, or Firm* — Keating & Bennett, LLP

(57) ABSTRACT

A multilayer filter includes first and second ground electrodes and first and second LC resonators. The first LC resonator includes a first line electrode, a first capacitor electrode, a first via conductor, and a second via conductor. The second via conductor extends from the first line electrode to a first capacitor electrode side and connects the first line electrode and the first ground electrode. The second LC resonator includes a second line electrode, a second capacitor electrode, a third via conductor, and a fourth via conductor. The fourth via conductor extends from the second line electrode to a second capacitor electrode side and connects the second line electrode and the second ground electrode.

14 Claims, 18 Drawing Sheets

(56) References Cited

FOREIGN PATENT DOCUMENTS

| | | |
|---|---|---|
| WO | 2017/169354 A1 | 10/2017 |
| WO | 2018/100918 A1 | 6/2018 |
| WO | 2019/087739 A1 | 5/2019 |

MULTILAYER FILTER

CROSS REFERENCE TO RELATED APPLICATIONS

This application claims the benefit of priority to Japanese Patent Application No. 2019-218719 filed on Dec. 3, 2019 and is a Continuation application of PCT Application No. PCT/JP2020/040084 filed on Oct. 26, 2020. The entire contents of each application are hereby incorporated herein by reference.

BACKGROUND OF THE INVENTION

1. Field of the Invention

The present invention relates to a multilayer filter.

2. Description of the Related Art

In the related art, a multilayer filter includes a multilayer body including a plurality of dielectric layers. For example, International Publication No. 2002/009225 discloses a laminated bandpass filter. In the laminated bandpass filter, two strip lines forming a resonator are placed at a certain distance from each other on the same layer. The two strip lines are placed in parallel with each other to thus make it possible to produce electromagnetic coupling. As a result, a capacitor between resonators can be rendered unnecessary, and a low-profile laminated body can be provided.

Furthermore, International Publication No. 2007/119356 discloses a multilayer bandpass filter in which the direction of a loop formed by an inductor electrode of an input-side LC parallel resonator is opposite to the direction of a loop formed by an inductor electrode of an LC parallel resonator adjacent to the inductor electrode of the input-side LC parallel resonator. Furthermore, there is disclosed a multilayer bandpass filter in which three ground electrodes separated from one another are formed on a ground electrode formation layer.

To improve attenuation characteristics (frequency characteristics of insertion loss outside a pass band) of a multilayer filter, electromagnetic coupling (electric field coupling and magnetic field coupling) between resonators has to be balanced, and both an increase in the steepness of a change in attenuation at boundaries of the pass band and the provision of attenuation outside the pass band have to be achieved. In the laminated bandpass filter disclosed in International Publication No. 2002/009225, however, the balance of electromagnetic coupling that occurs between the two strip lines placed in parallel is not considered.

As disclosed in International Publication No. 2007/119356, when the directions of loops formed by inductor electrodes of two LC parallel resonators adjacent to each other are opposite to each other, magnetic field coupling can be weakened, but it is difficult to finely adjust magnetic field coupling. Furthermore, when a plurality of ground electrodes are formed on the same dielectric layer, manufacturing variations are likely to occur.

SUMMARY OF THE INVENTION

Preferred embodiments of the present invention provide multilayer filters each having improve attenuation characteristics.

A multilayer filter according to a preferred embodiment of the present invention includes a first ground electrode and a second ground electrode, a first LC resonator, and a second LC resonator. The first LC resonator is connected to the first ground electrode. The second LC resonator is connected to the second ground electrode. The first LC resonator includes a first line electrode, a first capacitor electrode, a first via conductor, and a second via conductor. The first capacitor electrode is between the first ground electrode and the first line electrode. The first via conductor connects the first line electrode and the first capacitor electrode. The second via conductor extends from the first line electrode to a first capacitor electrode side and connects the first line electrode and the first ground electrode. The second LC resonator includes a second line electrode, a second capacitor electrode, a third via conductor, and a fourth via conductor. The second capacitor electrode is between the second ground electrode and the second line electrode. The third via conductor connects the second line electrode and the second capacitor electrode. The fourth via conductor extends from the second line electrode to a second capacitor electrode side and connects the second line electrode and the second ground electrode.

In a multilayer filter according to preferred embodiment of the present invention, the first LC resonator is connected to the first ground electrode, and the second LC resonator is also connected to the second ground electrode, thus enabling an improvement in attenuation characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
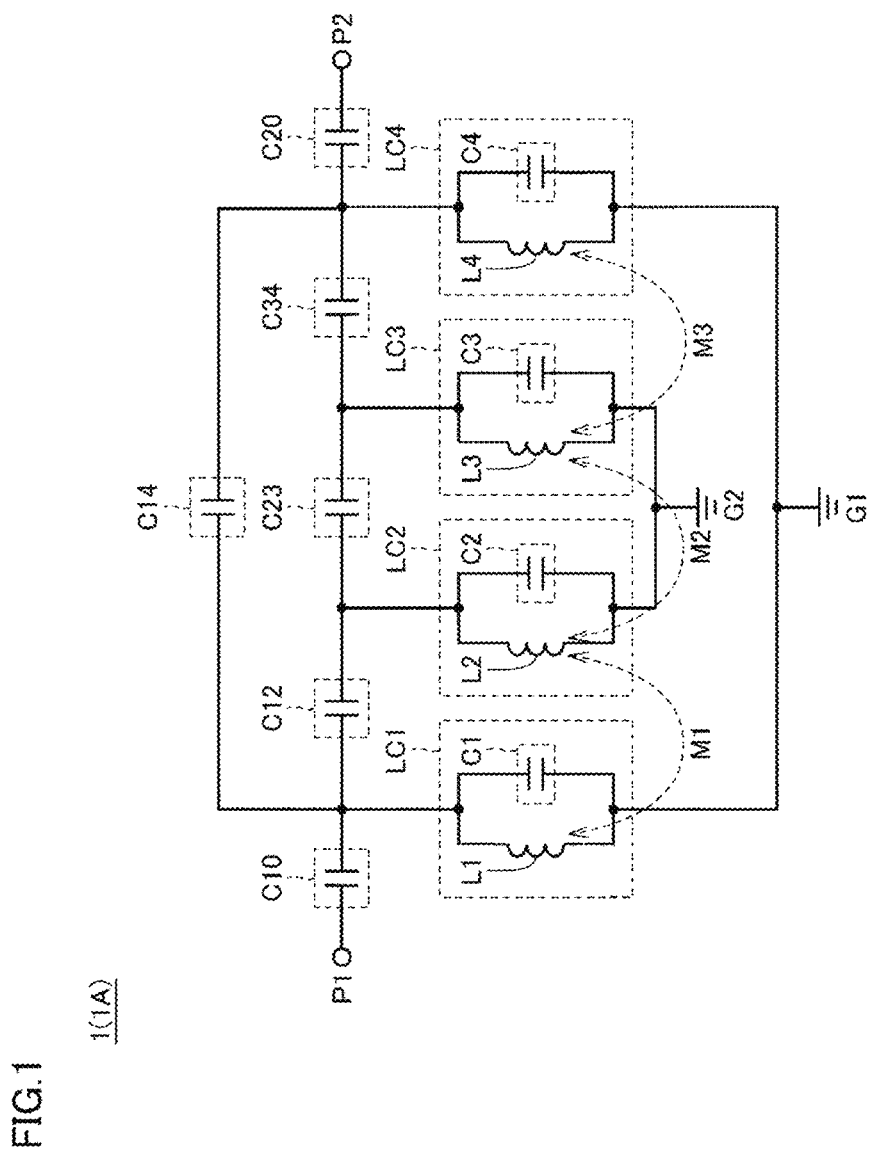
FIG. 1 is an equivalent circuit diagram of a multilayer filter according to Preferred Embodiment 1 of the present invention.

Preferred embodiments of the present invention will be described in detail below with reference to the drawings. The same or corresponding elements or portions in the drawings are denoted by the same reference signs and a repeated description thereof may be omitted.

Preferred Embodiment 1

FIG. 1 is an equivalent circuit diagram of a multilayer filter 1 according to Preferred Embodiment 1 of the present invention. An equivalent circuit illustrated in FIG. 1 is the same as or similar to an equivalent circuit of a multilayer filter 1A according to a modification of Preferred Embodiment 1 to be described below. In the following description, electric field coupling occurring between two circuit elements is represented by a capacitor. In other words, the two circuit elements are connected to each other via the capacitor. Furthermore, among cases where two circuit elements are electrically connected to each other are a case where the two circuit elements are directly connected to each other and a case where the two circuit elements are coupled to each other through electric field coupling (capacitive coupling).

As illustrated in FIG. 1, the multilayer filter 1 includes an input/output terminal P1 (first terminal), an input/output terminal P2 (second terminal), an LC parallel resonator LC1 (first LC resonator), an LC parallel resonator LC2 (second LC resonator), an LC parallel resonator LC3 (fourth LC resonator), an LC parallel resonator LC4 (third LC resonator), and capacitors C10, C12, C14, C20, C23, and C34.

In FIG. 1, the LC parallel resonators LC1 and LC2 are coupled to each other through electromagnetic field coupling. Magnetic field coupling M1 and the capacitor C12 respectively denote magnetic field coupling and electric field coupling between the LC parallel resonators LC1 and LC2. The LC parallel resonators LC2 and LC3 are coupled to each other through electromagnetic field coupling. Magnetic field coupling M2 and the capacitor C23 respectively denote magnetic field coupling and electric field coupling between the LC parallel resonators LC2 and LC3. The LC parallel resonators LC3 and LC4 are coupled to each other through electromagnetic field coupling. Magnetic field coupling M3 and the capacitor C34 respectively denote magnetic field coupling and electric field coupling between the LC parallel resonators LC3 and LC4. In some cases, electric field coupling is achieved by a capacitor.

The input/output terminal P1 is electrically connected to the LC parallel resonator LC1. FIG. 1 illustrates the case where the input/output terminal P1 is connected to the LC parallel resonator LC1 via the capacitor C10. The input/output terminal P1 may be directly connected to the LC parallel resonator LC1.

The input/output terminal P2 is electrically connected to the LC parallel resonator LC4. FIG. 1 illustrates the case where the input/output terminal P2 is connected to the LC parallel resonator LC4 via the capacitor C20. The input/output terminal P2 may be directly connected to the LC parallel resonator LC4.

The LC parallel resonators LC1 and LC2 are connected to each other via the capacitor C12. The LC parallel resonators LC2 and LC3 are connected to each other via the capacitor C23. The LC parallel resonators LC3 and LC4 are connected to each other via the capacitor C34. The LC parallel resonators LC1 and LC4 are connected to each other via the capacitor C14.

The LC parallel resonator LC1 includes an inductor L1 and a capacitor C1. The inductor L1 and the capacitor C1 are connected in parallel between a ground point G1 and a connection point between the capacitors C10 and C12.

The LC parallel resonator LC2 includes an inductor L2 and a capacitor C2. The inductor L2 and the capacitor C2 are connected in parallel between a ground point G2 and a connection point between the capacitors C12 and C23.

The LC parallel resonator LC3 includes an inductor L3 and a capacitor C3. The inductor L3 and the capacitor C3 are connected in parallel between the ground point G2 and a connection point between the capacitors C23 and C34.

The LC parallel resonator LC4 includes an inductor L4 and a capacitor C4. The inductor L4 and the capacitor C4 are connected in parallel between the ground point G1 and a connection point between the capacitors C34 and C20.

Figure 2:
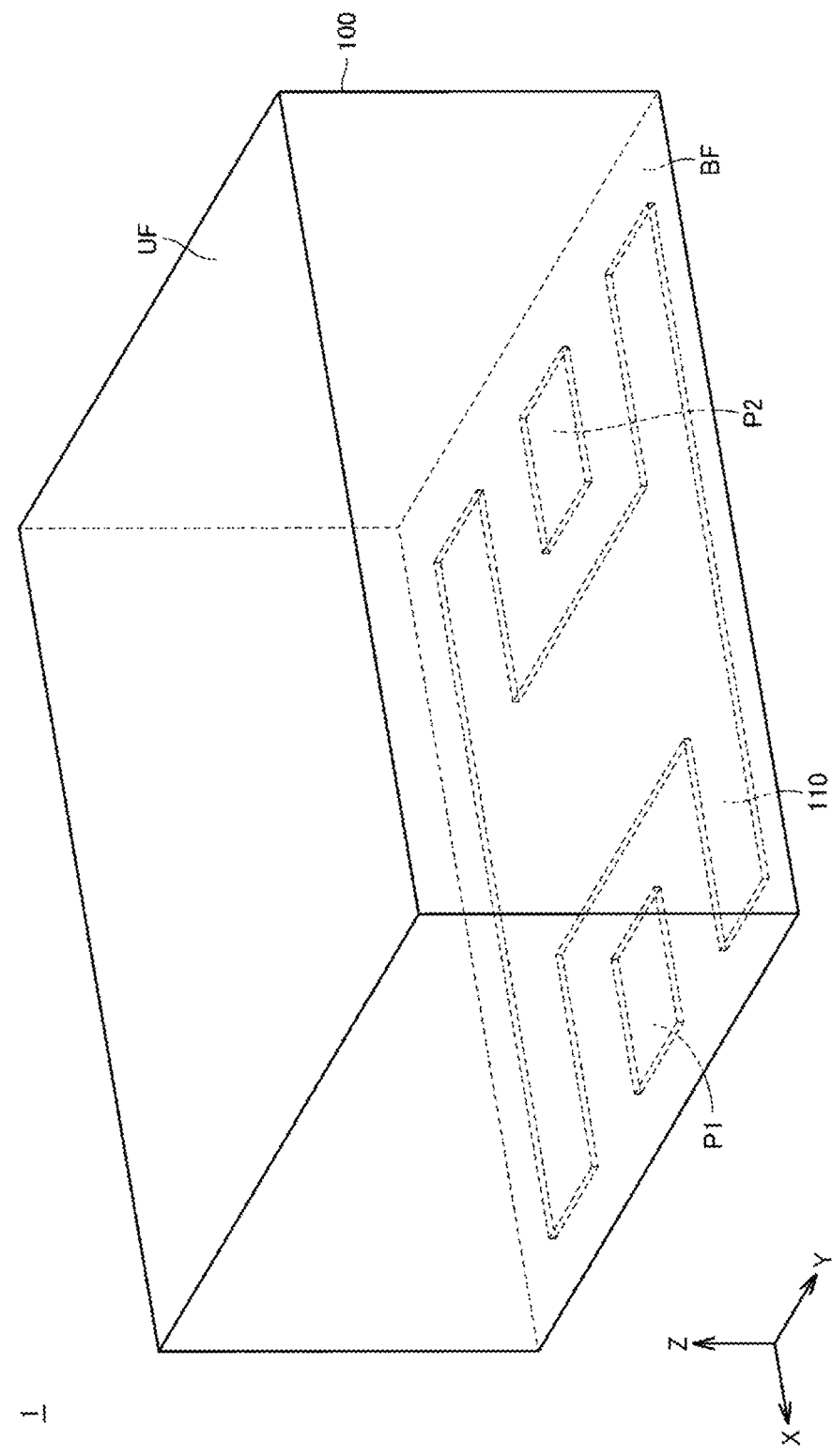
FIG. 2 is an external perspective view of the multilayer filter in FIG. 1.

FIG. 2 is an external perspective view of the multilayer filter 1 in FIG. 1. In FIG. 2, the X-axis, the Y-axis, and the Z-axis are orthogonal or substantially orthogonal to each other. The same applies to FIGS. 3 to 5, 9, and 11 to be described.

As illustrated in FIG. 2, the multilayer filter 1 includes a multilayer body 100 including a plurality of dielectric layers that are laminated in a Z-axis direction. The multilayer body 100 has, for example, a rectangular or substantially rectangular parallelepiped shape. Surfaces of outermost layers of the multilayer body 100 that are perpendicular or substantially perpendicular to the Z-axis direction are an upper surface UF and a bottom surface BF. The upper surface UF and the bottom surface BF face each other in the Z-axis direction.

On the bottom surface BF, the input/output terminals P1 and P2, and a ground terminal 110 are provided. The input/output terminals P1 and P2, and the ground terminal 110 are, for example, LGA (Land Grid Array) terminals in which planar electrodes are regularly provided on the bottom surface BF. The bottom surface BF is connected to a circuit board that is not illustrated.

Figure 3:
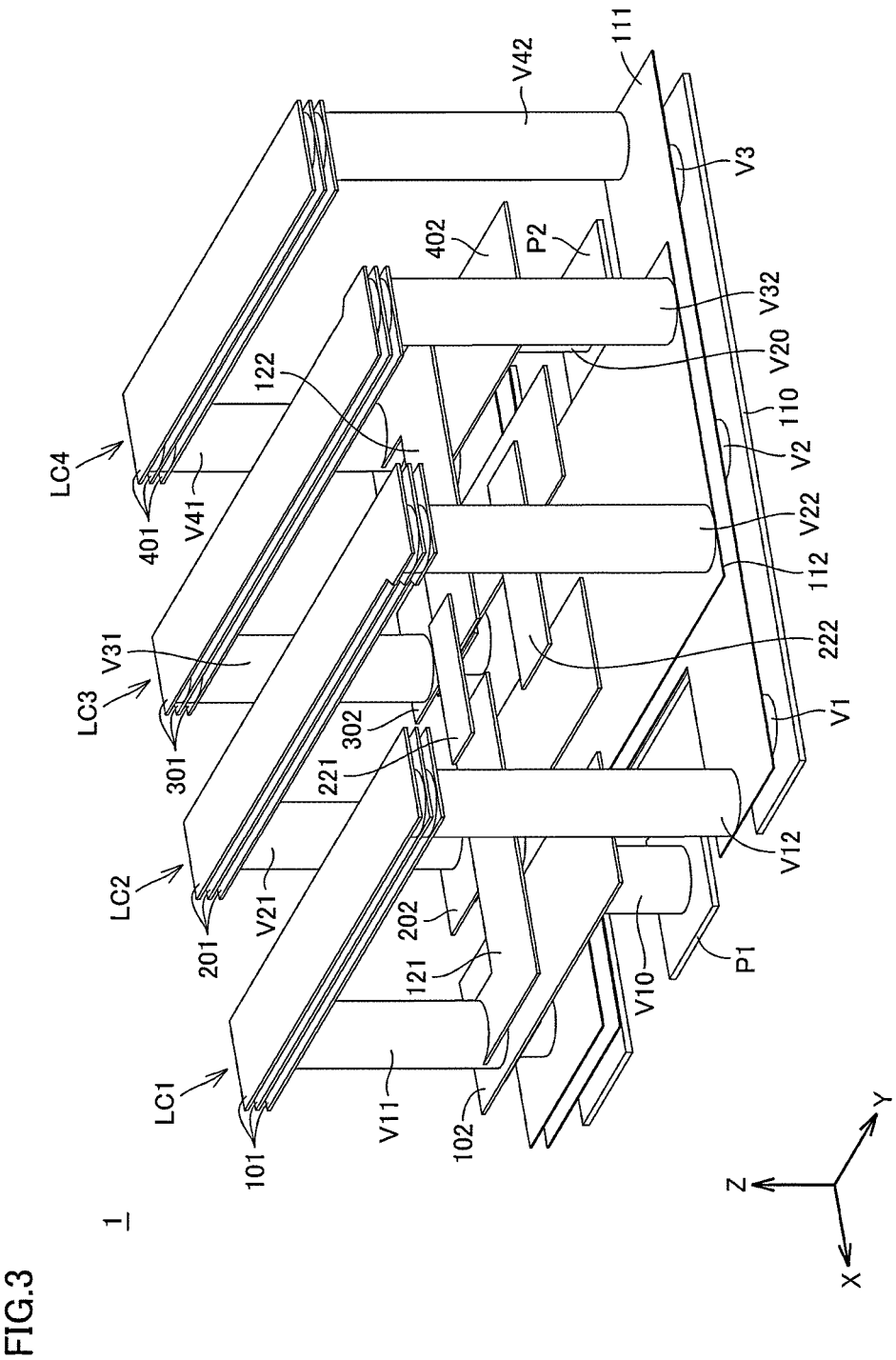
FIG. 3 illustrates a plurality of electrodes provided in a multilayer body in FIG. 2.
Figure 4:
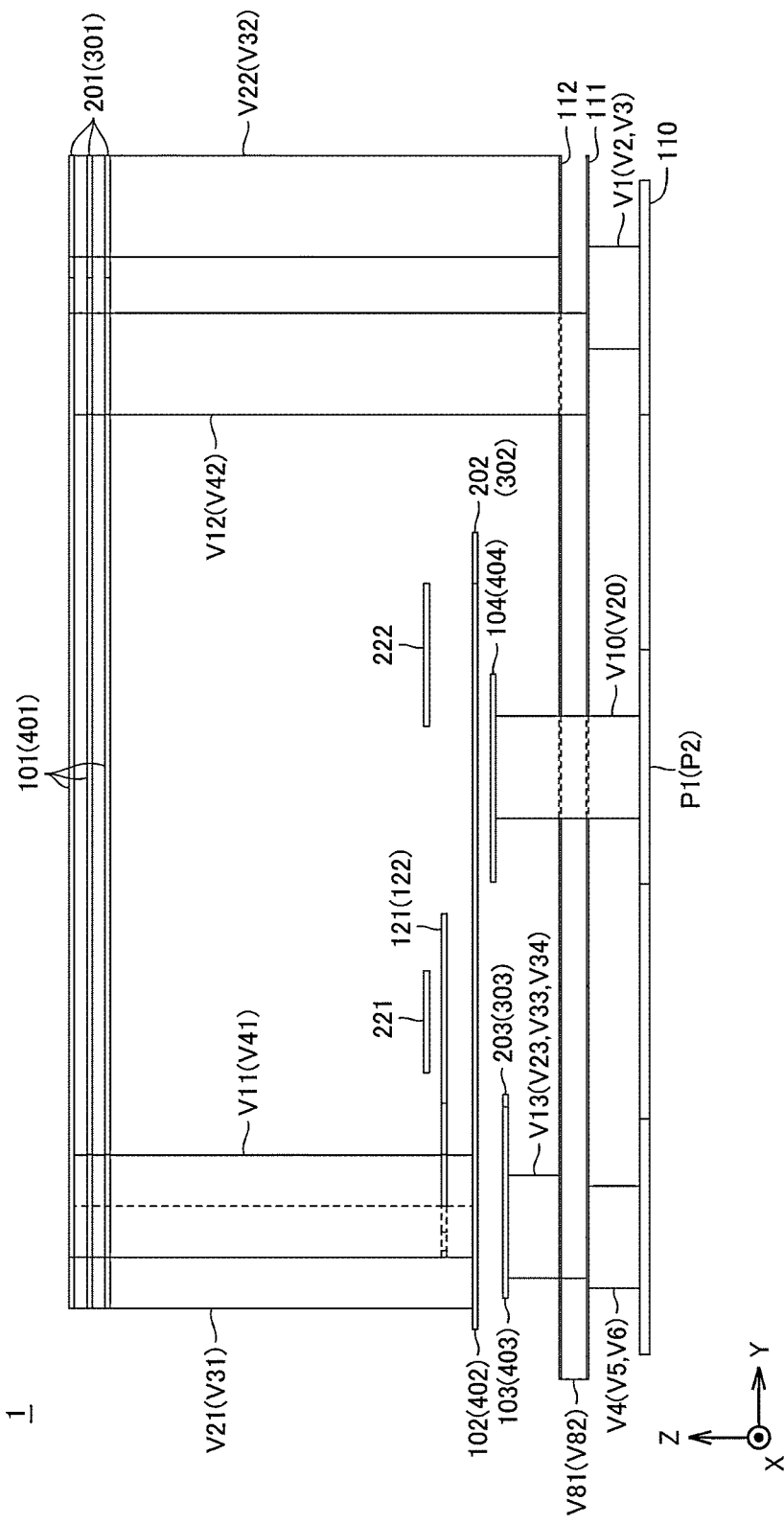
FIG. 4 illustrates the multilayer filter in FIG. 2 as viewed in plan from an X-axis direction (second direction).
Figure 5:
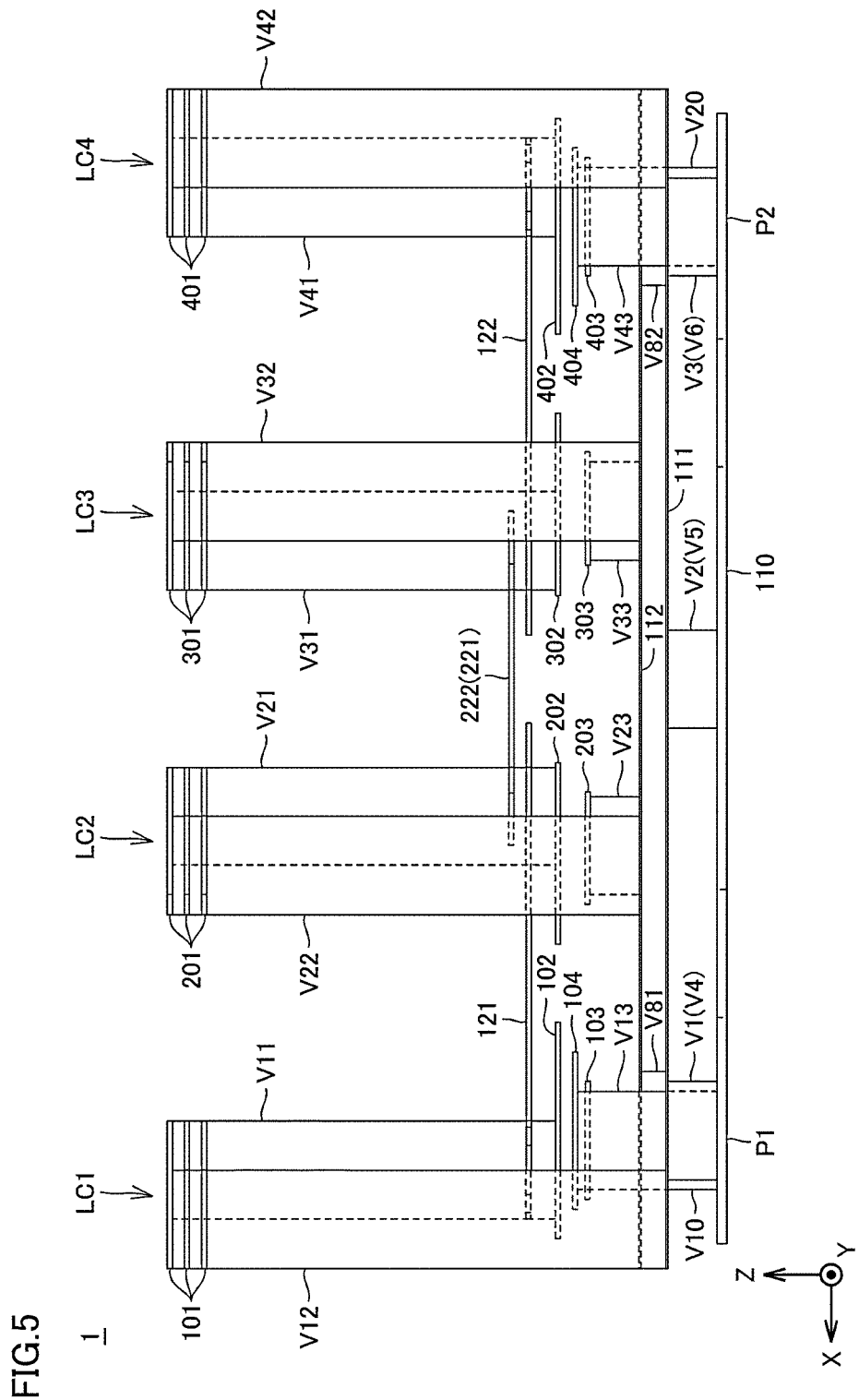
FIG. 5 illustrates the multilayer filter in FIG. 2 as viewed in plan from a Y-axis direction (first direction).

FIG. 3 illustrates a plurality of electrodes provided in the multilayer body 100 in FIG. 2. FIG. 4 illustrates the multilayer filter 1 in FIG. 2 as viewed in plan from an X-axis direction (second direction). FIG. 5 illustrates the multilayer filter 1 in FIG. 2 as viewed in plan from a Y-axis direction (first direction).

Referring to FIGS. 1 and 3 to 5, in the multilayer body 100, a ground electrode 111 (first ground electrode) and a ground electrode 112 (second ground electrode) are provided. The ground electrode 111 is disposed between the ground terminal 110 and the ground electrode 112. The ground electrode 111 is connected to the ground terminal 110 by via conductors V1, V2, V3, V4, V5, and V6 (second via conductors). The ground electrode 112 is connected to the ground electrode 111 by each of a via conductor V81 (first ground via conductor) and a via conductor V82 (first ground via conductor). The ground electrodes 111 and 112 correspond to the respective ground points G1 and G2 in FIG. 1. The ground electrodes 111 and 112 are provided as separate conductors.

The LC parallel resonator LC1 includes a line electrode 101 (first line electrode), a capacitor electrode 102 (first capacitor electrode), a capacitor electrode 103, a via conductor V11 (first via conductor), and a via conductor V12 (second via conductor). The line electrode 101 extends in the Y-axis direction. The capacitor electrode 102 is disposed between the ground electrode 112 and the line electrode 101. The via conductor V11 connects the line electrode 101 and the capacitor electrode 102. The via conductor V12 extends from the line electrode 101 to a capacitor electrode 102 side and connects the line electrode 101 and the ground electrode 111. The capacitor electrode 103 is disposed between the capacitor electrode 102 and the ground electrode 112. The capacitor electrode 103 is connected to the ground electrode 112 by a via conductor V13. In a direction in which the via conductor V11 extends, a distance between the line electrode 101 and the ground electrode 112 is shorter than a distance between the line electrode 101 and the ground electrode 111.

A capacitor electrode 104 (fifth capacitor electrode) is disposed between the input/output terminal P1 and the capacitor electrode 102. The capacitor electrode 104 is connected to the input/output terminal P1 by a via conductor V10.

The capacitor C10 includes the capacitor electrodes 102 and 104. The loop-shaped inductor L1 includes the via conductor V12, the line electrode 101, and the via conductor V11. The capacitor C1 includes the capacitor electrodes 102 and 103.

The LC parallel resonator LC2 includes a line electrode 201 (second line electrode), a capacitor electrode 202 (second capacitor electrode), a capacitor electrode 203, a via conductor V21 (third via conductor), and a via conductor V22 (fourth via conductor). The line electrode 201 extends in the Y-axis direction. The capacitor electrode 202 is disposed between the ground electrode 112 and the line electrode 201. The via conductor V21 connects the line electrode 201 and the capacitor electrode 202. The via conductor V22 extends from the line electrode 201 to a capacitor electrode 202 side and connects the line electrode 201 and the ground electrode 112. The capacitor electrode 203 is disposed between the capacitor electrode 202 and the ground electrode 112. The capacitor electrode 203 is connected to the ground electrode 112 by a via conductor V23.

The loop-shaped inductor L2 includes the via conductor V22, the line electrode 201, and the via conductor V21. The capacitor C2 includes the capacitor electrodes 202 and 203.

A coupling electrode 121 (third coupling electrode) is connected to the via conductor V11 between the line electrode 101 and the capacitor electrode 102. The coupling electrode 121 faces each of the capacitor electrodes 102 and 202. The capacitor C12 includes the capacitor electrodes 102 and 202 and the coupling electrode 121.

The LC parallel resonator LC3 includes a line electrode 301 (second line electrode), a capacitor electrode 302 (second capacitor electrode), a capacitor electrode 303, a via conductor V31 (third via conductor), and a via conductor V32 (fourth via conductor). The line electrode 301 extends in the Y-axis direction. The capacitor electrode 302 is disposed between the ground electrode 112 and the line electrode 301. The via conductor V31 connects the line electrode 301 and the capacitor electrode 302. The via conductor V32 extends from the line electrode 301 to a capacitor electrode 302 side and connects the line electrode 301 and the ground electrode 112. The capacitor electrode 303 is disposed between the capacitor electrode 302 and the ground electrode 112. The capacitor electrode 303 is connected to the ground electrode 112 by a via conductor V33.

The loop-shaped inductor L3 includes the via conductor V32, the line electrode 301, and the via conductor V31. The capacitor C3 includes the capacitor electrodes 302 and 303.

A coupling electrode 222 is disposed between the line electrode 201 and the capacitor electrode 202. The coupling electrode 222 faces each of the capacitor electrodes 202 and 302. The capacitor C23 includes the capacitor electrodes 202 and 302 and the coupling electrode 222.

The LC parallel resonator LC4 includes a line electrode 401 (third line electrode), a capacitor electrode 402 (third capacitor electrode), a capacitor electrode 403, a via conductor V41 (fifth via conductor), and a via conductor V42 (sixth via conductor). The line electrode 401 extends in the Y-axis direction. The capacitor electrode 402 is disposed between the ground electrode 112 and the line electrode 401. The via conductor V41 connects the line electrode 401 and the capacitor electrode 402. The via conductor V42 extends from the line electrode 401 to a capacitor electrode 402 side and connects the line electrode 401 and the ground electrode 111. The capacitor electrode 403 is disposed between the capacitor electrode 402 and the ground electrode 112. The capacitor electrode 403 is connected to the ground electrode 112 by a via conductor V43.

A capacitor electrode 404 (sixth capacitor electrode) is disposed between the input/output terminal P2 and the capacitor electrode 402. The capacitor electrode 404 is connected to the input/output terminal P2 by a via conductor V20.

The capacitor C20 includes the capacitor electrodes 402 and 404. The loop-shaped inductor L4 includes the via conductor V42, the line electrode 401, and the via conductor V41. The capacitor C4 includes the capacitor electrodes 402 and 403.

A coupling electrode 221 is disposed between the line electrode 201 and the capacitor electrode 202. The coupling electrode 221 faces each of coupling electrodes 121 and 122. The capacitor C14 includes the coupling electrodes 121, 122, and 221.

Referring to FIG. 4, in the Y-axis direction, each of the via conductors V21, V31, and V41 is closer to the via conductor V11 than the via conductor V12 is. In the Y-axis direction, the via conductors V22, V32, and V42 are closer to the via conductor V12 than the via conductor V11 is. Winding directions of the inductors L1 to L4 from the corresponding ground electrodes to the respective capacitor electrodes are the same. Air core portions of the inductors L1 to L4 coincide with each other. In the Y-axis direction, the via conductors V81 and V82 are closer to the via conductor V11 than the via conductor V12 is.

Figure 6:
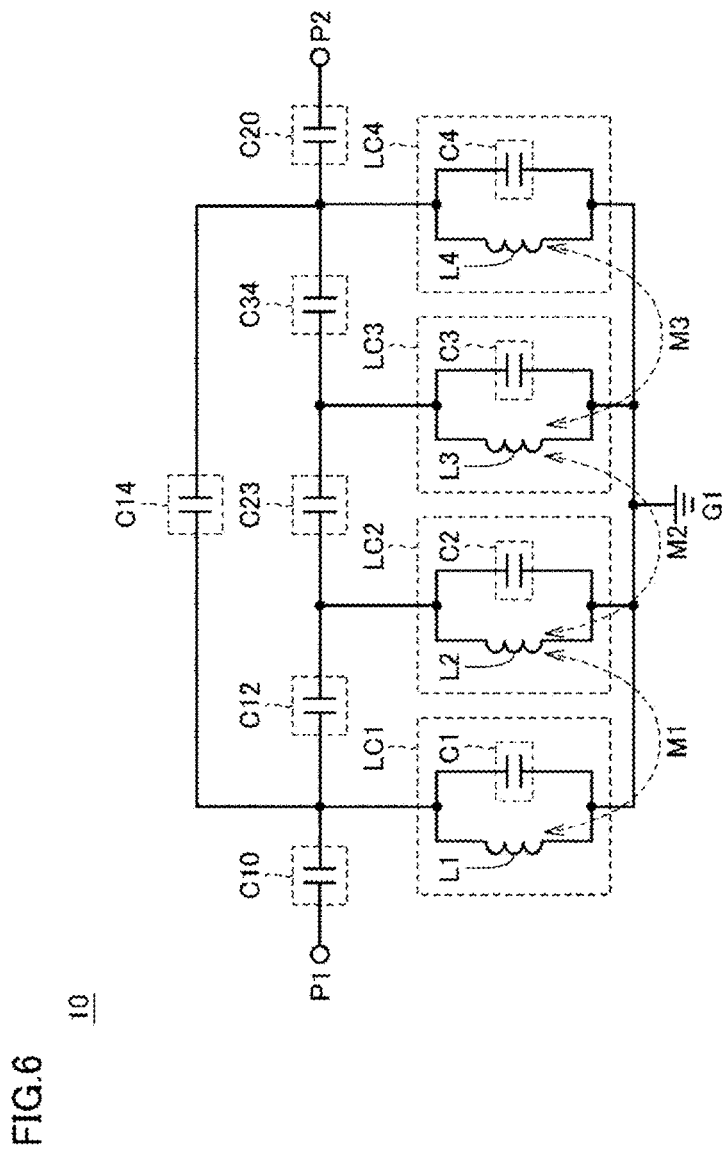
FIG. 6 is an equivalent circuit diagram of a multilayer filter according to a comparative example.

FIG. 6 is an equivalent circuit diagram of a multilayer filter 10 according to a comparative example. An equivalent circuit of the multilayer filter 10 is an equivalent circuit obtained by removing the ground point G2 from the equivalent circuit of the multilayer filter 1 in FIG. 1 and short-circuiting each of the LC parallel resonators LC1 to LC4 to the ground point G1. Configurations other than these are the same as or similar to those in the multilayer filter 1 in FIG. 1, and thus a repeated description thereof is not provided.

Figure 7:
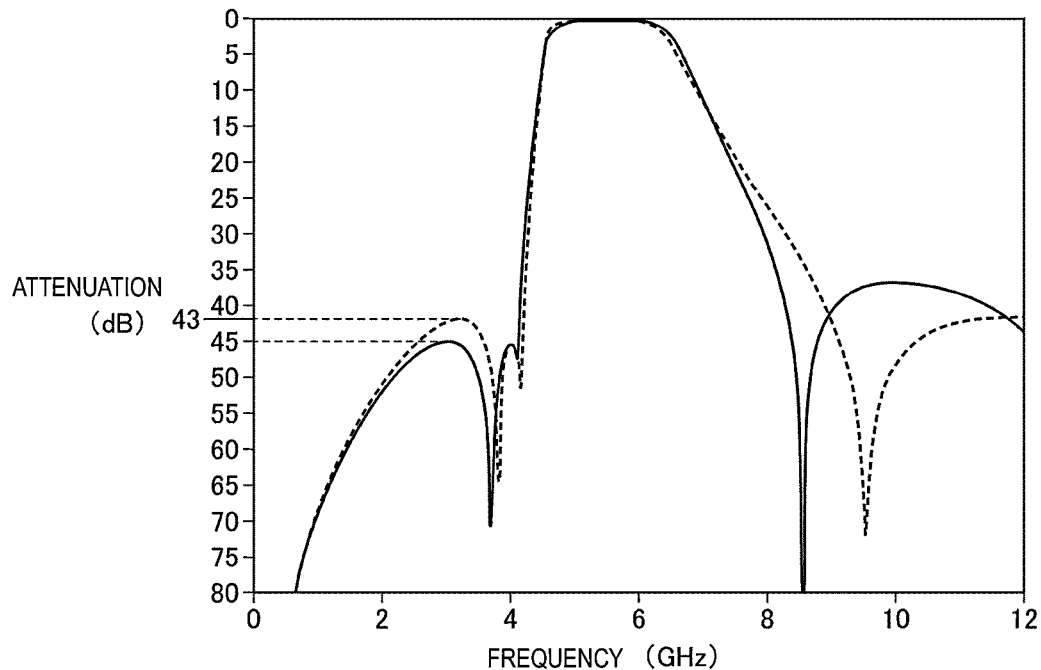
FIG. 7 illustrates a bandpass characteristic (solid line) of the multilayer filter in FIGS. 1 to 5 and a bandpass characteristic (dotted line) of the multilayer filter in FIG. 6.

FIG. 7 illustrates a bandpass characteristic (solid line) of the multilayer filter 1 in FIGS. 1 to 5 and a bandpass characteristic (dotted line) of the multilayer filter 10 in FIG. 6. A bandpass characteristic refers to a frequency characteristic of insertion loss. In FIG. 7, attenuation represented by the vertical axis increases downward from 0 dB. The same applies to FIGS. 8, 12, and 13 to be described.

Referring to FIGS. 1, 5, and 7, the ground point G1 (ground electrode 111) to which each of the LC parallel resonators LC1 and LC4 is short-circuited and the ground point G2 (ground electrode 112) to which each of the LC parallel resonators LC2 and LC3 is short-circuited are physically separated, thus reducing the magnetic field coupling M1 and the magnetic field coupling M3. As a result, attenuation characteristics of the multilayer filter 1 are improved.

As illustrated in FIG. 7, in a frequency band ranging from about 2 GHz to about 4 GHz, a local minimum of insertion loss of the multilayer filter 1 is larger than that of the multilayer filter 10. In a lower frequency band (on a lower-frequency side) than a pass band, the multilayer filter 1 can provide larger attenuation than the multilayer filter 10. That is, the attenuation characteristics of the multilayer filter 1 are improved in comparison with attenuation characteristics of the multilayer filter 10.

In the multilayer filter 1, when the via conductors V81 and V82 in FIG. 4 are moved in the Y-axis direction, an inductance component between the ground points G1 and G2 in FIG. 1 changes. As a result, the frequency of an attenuation pole that appears on a higher-frequency side can be adjusted.

Figure 8:
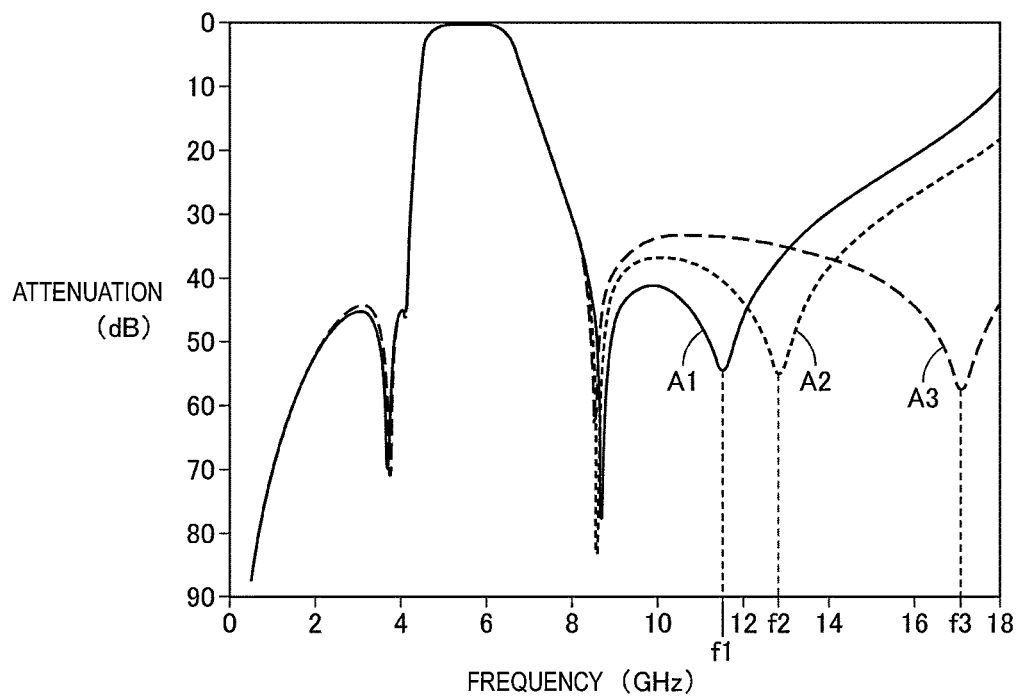
FIG. 8 illustrates changes in insertion loss of the multilayer filter when ground via conductors in FIG. 4 are moved in the Y-axis direction.

FIG. 8 illustrates changes in insertion loss of the multilayer filter 1 when the via conductors V81 and V82 in FIG. 4 are moved in the Y-axis direction. In FIG. 8, a bandpass characteristic A1 represents a bandpass characteristic when the via conductors V81 and V82 are disposed at locations illustrated in FIG. 4. A bandpass characteristic A2 represents a bandpass characteristic when the via conductors V81 and V82 are closer to the via conductor V12 than in the bandpass characteristic A1. A bandpass characteristic A3 represents a bandpass characteristic when the via conductors V81 and V82 are closer to the via conductor V12 than in the bandpass characteristic A2.

Referring to FIGS. 4 and 8, the bandpass characteristics A1 to A3 are almost the same in terms of bandpass characteristics in the pass band and on the lower-frequency side. In a higher frequency band (on the higher-frequency side) than the pass band of the bandpass characteristic A1, an attenuation pole appears at a frequency f1. On the higher-frequency side of the bandpass characteristic A2, an attenuation pole appears at a frequency f2 (>f1). On the higher-frequency side of the bandpass characteristic A3, an attenuation pole appears at a frequency f3 (>f2). When the via conductors V81 and V82 are brought close to the via conductor V12, the frequency of an attenuation pole that appears on the higher-frequency side can be increased.

In the multilayer filter 1, the case has been described where the capacitor electrodes 102, 202, 302, and 402 define the respective capacitors together with the capacitor electrodes 103, 203, 303, and 403 connected to the ground electrode 112. Each of the capacitor electrodes 102, 202, 302, and 402 may define a capacitor together with the ground electrode 112.

Figure 9:
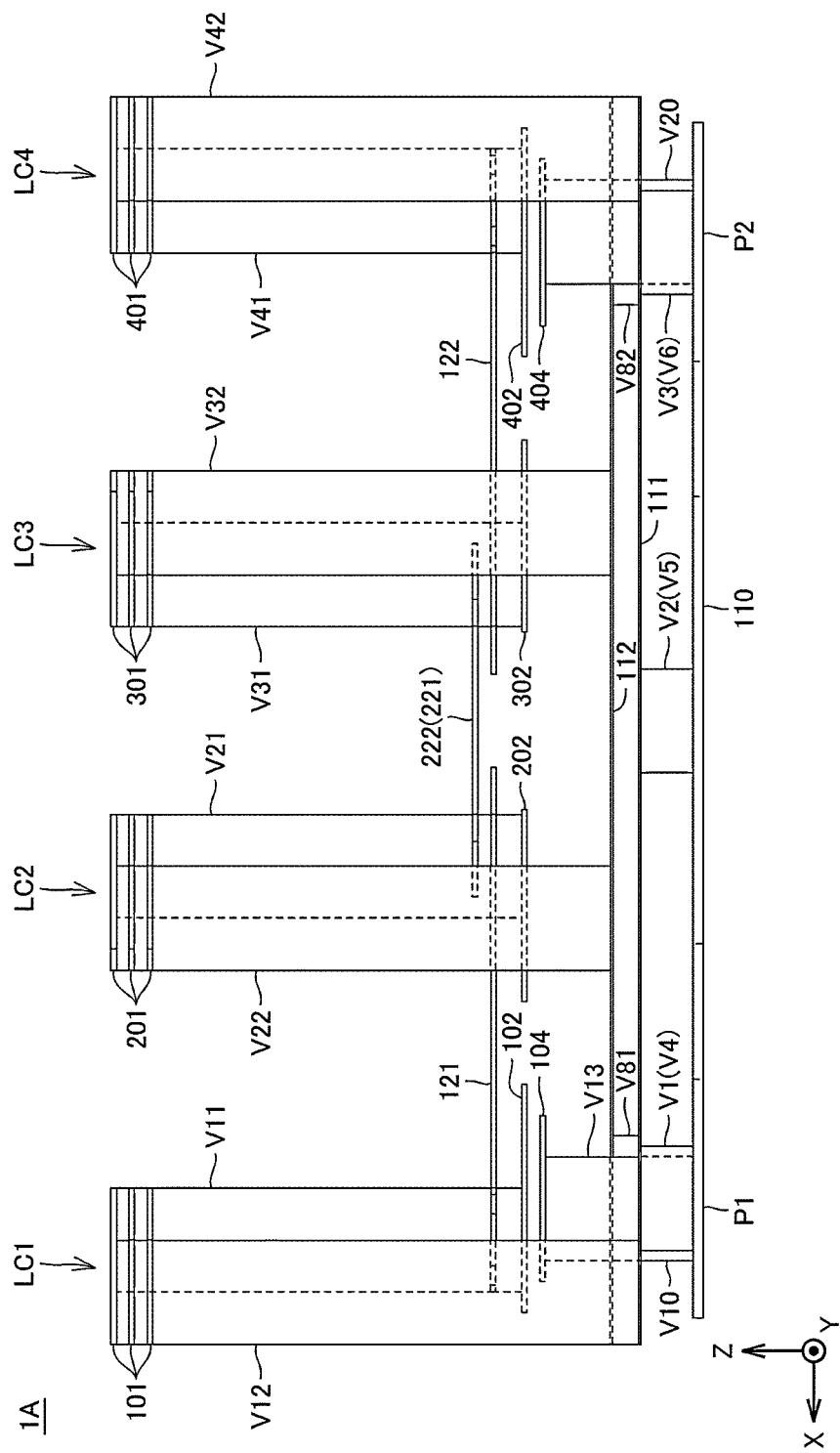
FIG. 9 illustrates an electrode structure in a multilayer body of a multilayer filter according to a modification of Preferred Embodiment 1 of the present invention as viewed in plan from the Y-axis direction.

FIG. 9 illustrates an electrode structure in a multilayer body of the multilayer filter 1A according to a modification of Preferred Embodiment 1 as viewed in plan from the Y-axis direction. The electrode structure of the multilayer filter 1A is an electrode structure obtained by removing the capacitor electrodes 103, 203, 303, and 403 and the via conductors V13, V23, V33, and V43 from an electrode structure of the multilayer filter 1 in FIG. 5. Configurations other than these are the same as or similar to those in the multilayer filter 1 in FIG. 5, and thus a repeated description thereof is not given.

Referring to FIGS. 1 and 9, the capacitor electrodes 102, 202, 302, and 402 face the ground electrode 112. In the multilayer filter 1A, the capacitor electrodes 102, 202, 302, and 402 define the respective capacitors C1 to C4 together with the ground electrode 112. When Preferred Embodiment 1 or the modification is selected in accordance with desired characteristics demanded of the multilayer filter, a distance between electrodes for each of the capacitors C1 to C4 can be adjusted.

Thus, the multilayer filters according to Preferred Embodiment 1 and the modification enable an improvement in attenuation characteristics.

Preferred Embodiment 2

In Preferred Embodiment 2 of the present invention, a configuration will be described in which two terminals of the multilayer filter according to Preferred Embodiment 1 are coupled to each other through electric field coupling to thus improve attenuation characteristics of the multilayer filter further.

Figure 10:
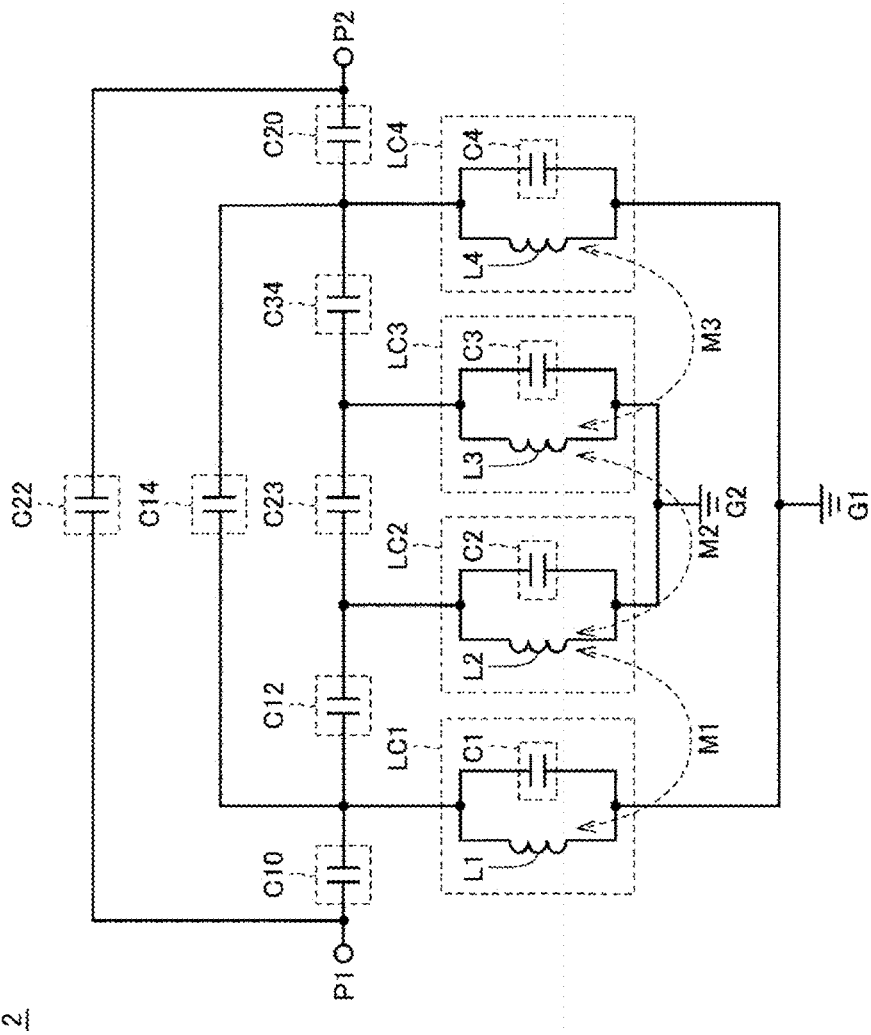
FIG. 10 is an equivalent circuit diagram of a multilayer filter according to Preferred Embodiment 2 of the present invention.

FIG. 10 is an equivalent circuit diagram of a multilayer filter 2 according to Preferred Embodiment 2. As illustrated in FIG. 10, an equivalent circuit of the multilayer filter 2 is an equivalent circuit obtained by adding a capacitor C22 to the equivalent circuit of the multilayer filter 1 in FIG. 1. Configurations other than these are the same as or similar to those in the multilayer filter 1 in FIG. 1, and thus a repeated description thereof is not provided. As illustrated in FIG. 10, the input/output terminals P1 and P2 are connected to each other via the capacitor C22.

Figure 11:
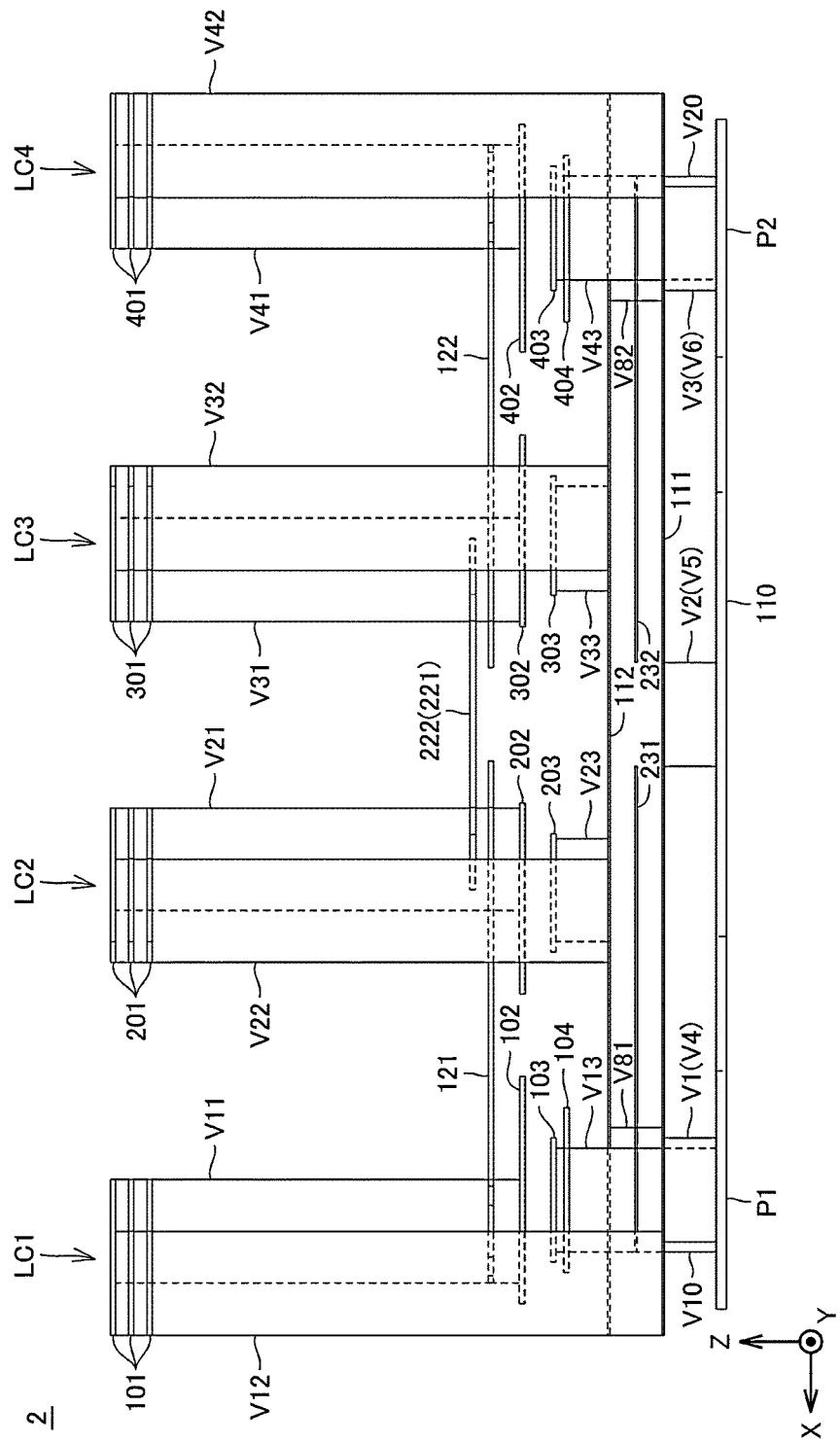
FIG. 11 illustrates an electrode structure in a multilayer body of the multilayer filter in FIG. 10 as viewed in plan from the Y-axis direction.

FIG. 11 illustrates an electrode structure in a multilayer body of the multilayer filter 2 in FIG. 10 as viewed in plan from the Y-axis direction. The electrode structure of the multilayer filter 2 is an electrode structure obtained by adding a coupling electrode 231 (first coupling electrode) and a coupling electrode 232 (second coupling electrode) to the electrode structure of the multilayer filter 1 in FIG. 5. Configurations other than these are the same as or similar to those in the multilayer filter 1 in FIG. 5, and thus a repeated description thereof is not provided.

As illustrated in FIG. 11, the coupling electrode 231 is connected to the via conductor V10 between the ground electrodes 111 and 112 and extends from the input/output terminal P1 toward the input/output terminal P2. The coupling electrode 232 is connected to the via conductor V20 between the ground electrodes 111 and 112 and extends from the input/output terminal P2 toward the input/output terminal P1. In a direction from the input/output terminal P1 toward the input/output terminal P2, a side of the coupling electrode 231 faces a side of the coupling electrode 232. The capacitor C22 in FIG. 10 includes the coupling electrodes 231 and 232.

Figure 12:
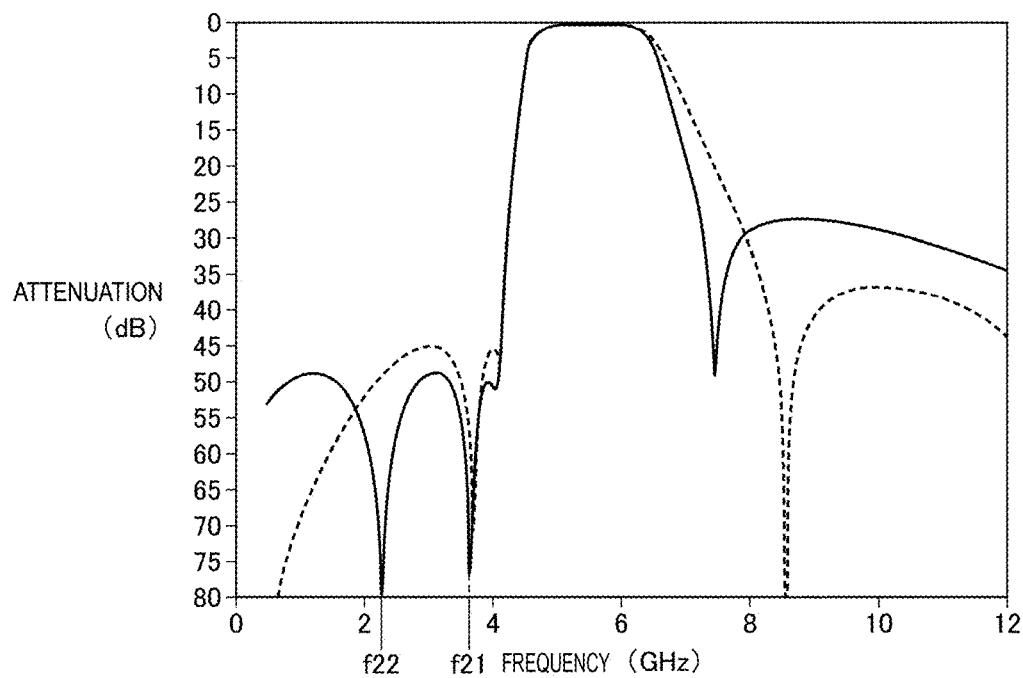
FIG. 12 illustrates a bandpass characteristic (solid line) of the multilayer filter in FIG. 11 and a bandpass characteristic (dotted line) of the multilayer filter in FIG. 5.

FIG. 12 illustrates a bandpass characteristic (solid line) of the multilayer filter 2 in FIG. 11 and a bandpass characteristic (dotted line) of the multilayer filter 1 in FIG. 5. As illustrated in FIG. 12, in the multilayer filter 1, an attenuation pole appears near a frequency f21 on the lower-frequency side. On the other hand, in the multilayer filter 2, an attenuation pole appears not only at the frequency f21 on the lower-frequency side, but also at a frequency f22 (<f21). As a result, on the lower-frequency side, a local minimum of insertion loss of the multilayer filter 2 is larger than that of the multilayer filter 1. On the lower-frequency side, the multilayer filter 2 can provide larger attenuation than the multilayer filter 1. That is, the attenuation characteristics of the multilayer filter 2 are improved in comparison with the attenuation characteristics of the multilayer filter 1.

Figure 13:
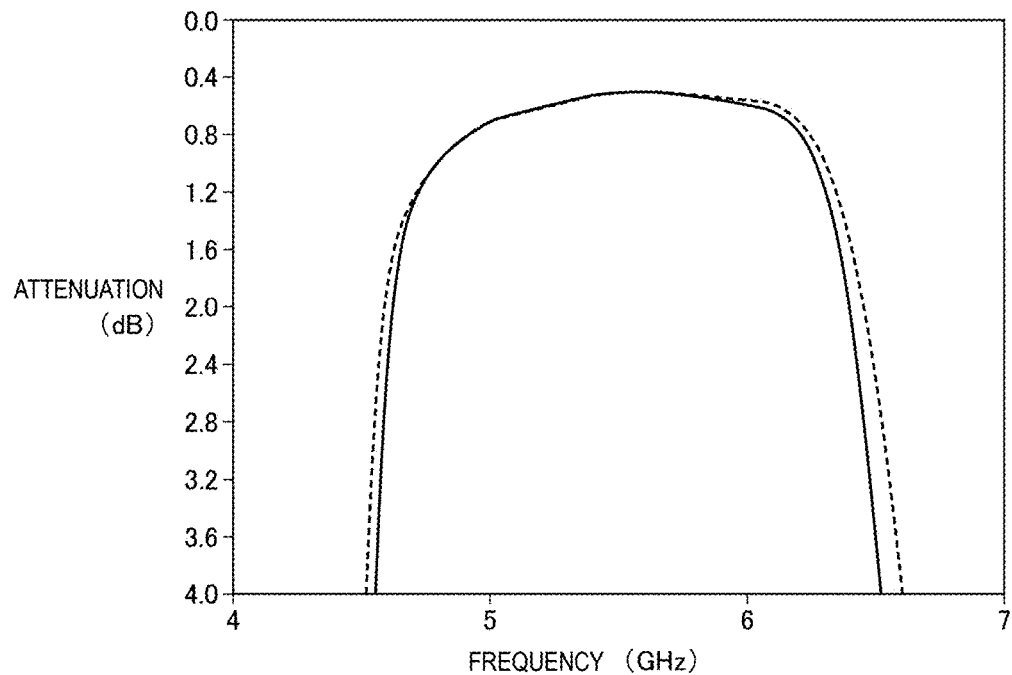
FIG. 13 is an enlarged view of a portion ranging from about 4 GHz to about 7 GHz in FIG. 12.

FIG. 13 is an enlarged view of a portion ranging from about 4 GHz to about 7 GHz in FIG. 12. As illustrated in FIG. 13, a minimum value of insertion loss of the multilayer filter 2 is the same or almost the same as a minimum value of insertion loss of the multilayer filter 1. That is, with respect to the bandpass characteristic in the pass band of the multilayer filter 2, the bandpass characteristic in the pass band of the multilayer filter 1 is maintained.

Thus, the multilayer filter according to Preferred Embodiment 2 enables a further improvement in attenuation characteristics while maintaining the bandpass characteristic in the pass band.

In Preferred Embodiments 1 and 2, the multilayer filters including four LC resonators have been described. The number of LC resonators included in a multilayer filter according to a preferred embodiment is not limited to four. In the following description, examples where the numbers of LC resonators included in multilayer filters according to preferred embodiments are 3, 5, 6, and 7 will be respectively described in Preferred Embodiments 3, 4, 5, and 6 of the present invention.

Preferred Embodiment 3

Figure 14:
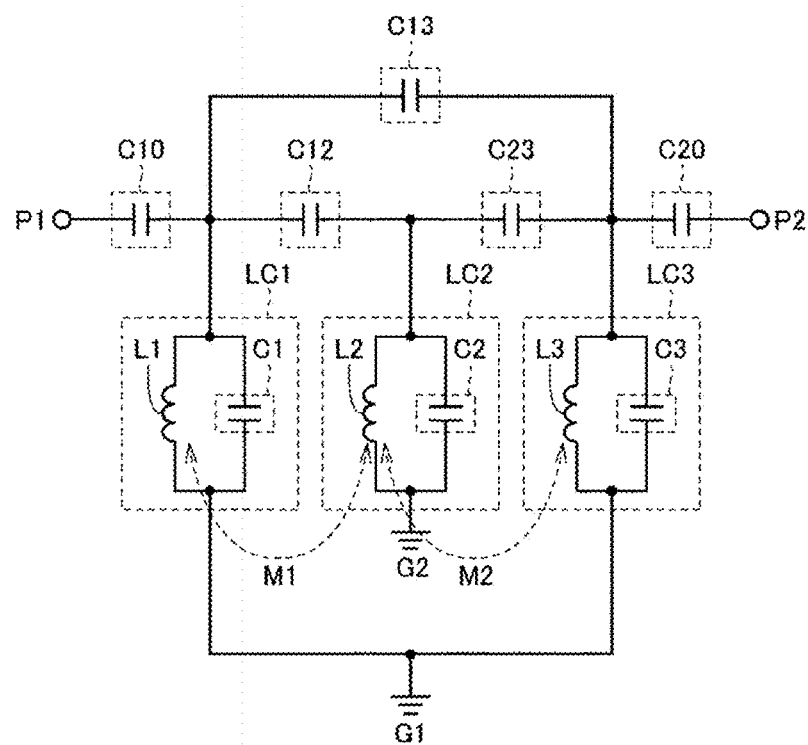
FIG. 14 is an equivalent circuit diagram of a multilayer filter according to Preferred Embodiment 3 of the present invention.

FIG. 14 is an equivalent circuit diagram of a multilayer filter 3 according to Preferred Embodiment 3 of the present invention. An equivalent circuit of the multilayer filter 3 is an equivalent circuit obtained by removing the LC parallel resonator LC4 from the LC parallel resonators LC1 to LC4 included in the multilayer filter 1 in FIG. 1. Configurations other than changes based on the removal of the LC parallel resonator LC4 are the same as or similar to those in the multilayer filter 1 in FIG. 1, and thus a repeated description thereof is not provided.

As illustrated in FIG. 14, the LC parallel resonator LC3 (third LC resonator) is connected to the ground point G1. The LC parallel resonator LC3 is connected to the input/output terminal P2 via the capacitor C20. The LC parallel resonator LC3 is connected to the LC parallel resonator LC1 via a capacitor C13.

Thus, the multilayer filter according to Preferred Embodiment 3 enables an improvement in attenuation characteristics.

Preferred Embodiment 4

Figure 15:
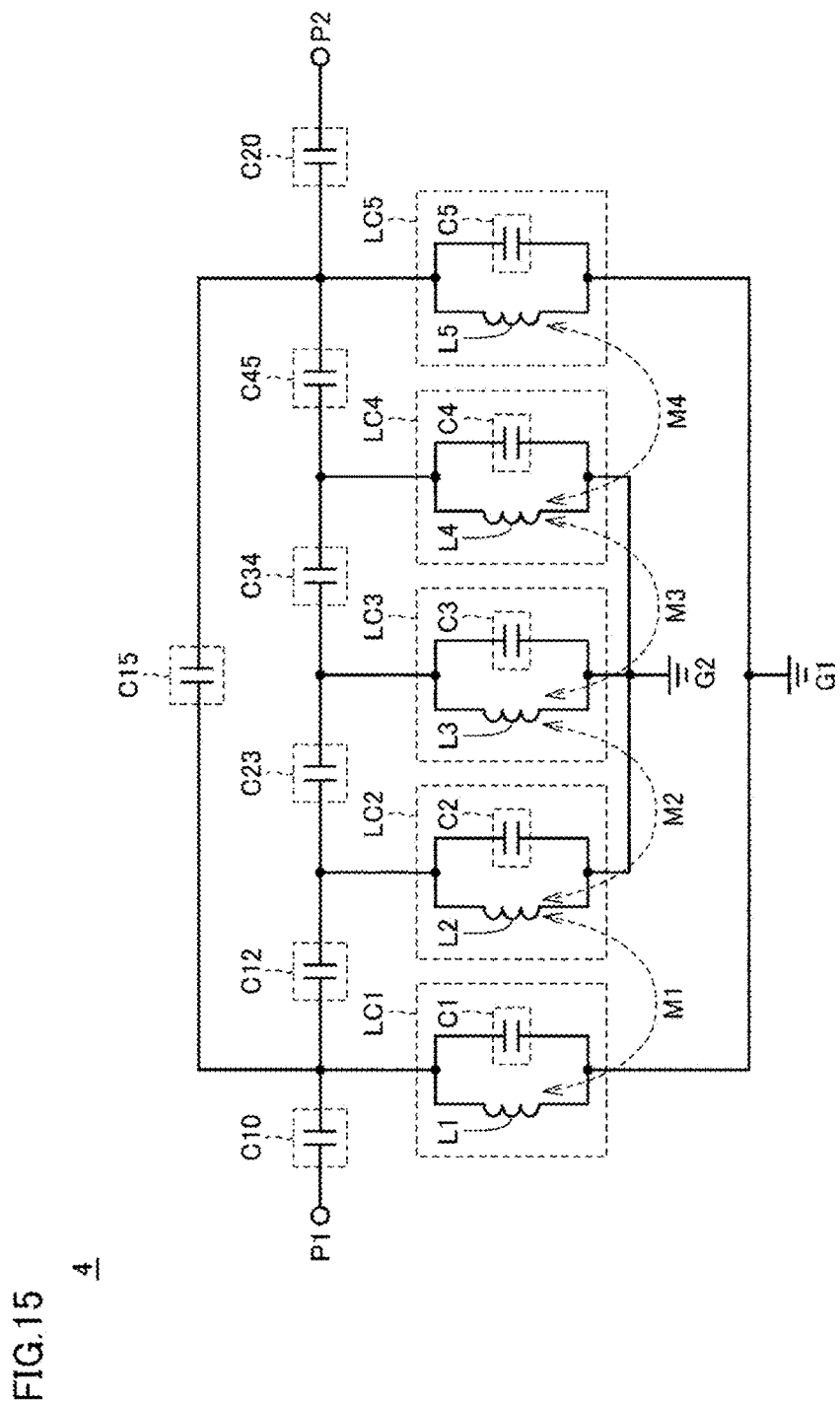
FIG. 15 is an equivalent circuit diagram of a multilayer filter according to Preferred Embodiment 4 of the present invention.

FIG. 15 is an equivalent circuit diagram of a multilayer filter 4 according to Preferred Embodiment 4 of the present invention. An equivalent circuit of the multilayer filter 4 is an equivalent circuit obtained by adding an LC parallel resonator LC5 (third LC resonator) to the LC parallel resonators LC1 to LC4 included in the multilayer filter 1 in FIG. 1. Configurations other than changes based on the addition of the LC parallel resonator LC5 are the same as or similar to those in the multilayer filter 1 in FIG. 1, and thus a repeated description thereof is not given.

As illustrated in FIG. 15, magnetic field coupling M4 denotes magnetic field coupling between the LC parallel resonators LC4 and LC5. The LC parallel resonator LC5 is connected to the LC parallel resonator LC4 (third LC resonator) via a capacitor C45. The LC parallel resonator LC5 is connected to the LC parallel resonator LC1 via a capacitor C15. The LC parallel resonator LC5 is connected to the input/output terminal P2 via the capacitor C20. The LC parallel resonator LC5 is connected to the ground point G1. The LC parallel resonator LC4 is connected to the ground point G2.

The LC parallel resonator LC5 includes an inductor L5 and a capacitor C5. The inductor L5 and the capacitor C5 are connected in parallel between the ground point G1 and a connection point between the capacitors C45 and C20.

Figure 16:
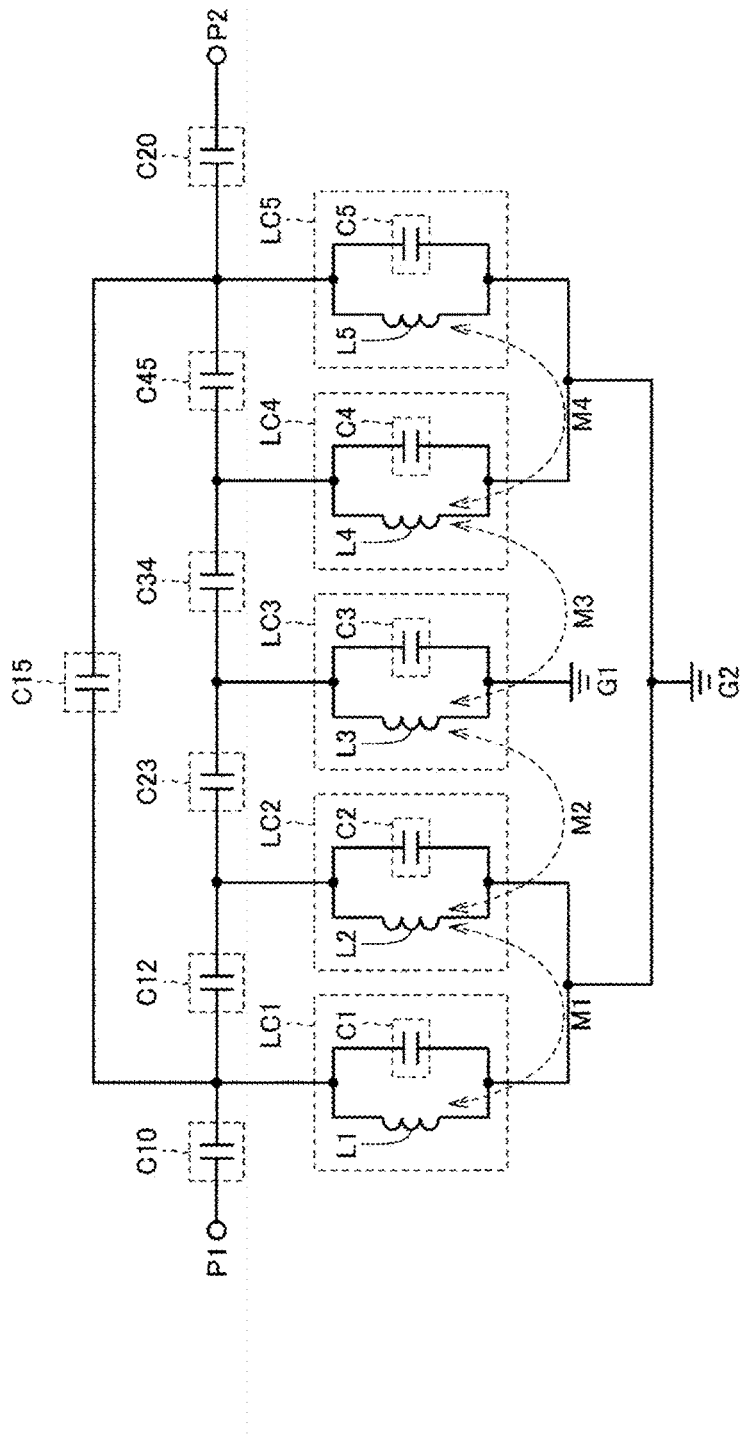
FIG. 16 is an equivalent circuit diagram of a multilayer filter according to a modification of Preferred Embodiment 4 of the present invention.

FIG. 16 is an equivalent circuit diagram of a multilayer filter 4A according to a modification of Preferred Embodiment 4. An equivalent circuit of the multilayer filter 4A is an equivalent circuit obtained by changing the ground point to which each of the LC parallel resonators LC1 and LC5 in FIG. 15 is connected from G1 to G2 and also changing the ground point to which the LC parallel resonator LC3 is connected from G2 to G1. Configurations other than these are the same as or similar to those in FIG. 15, and thus a repeated description thereof is not given.

Thus, the multilayer filters according to Preferred Embodiment 4 and the modification enable an improvement in attenuation characteristics.

Preferred Embodiment 5

Figure 17:
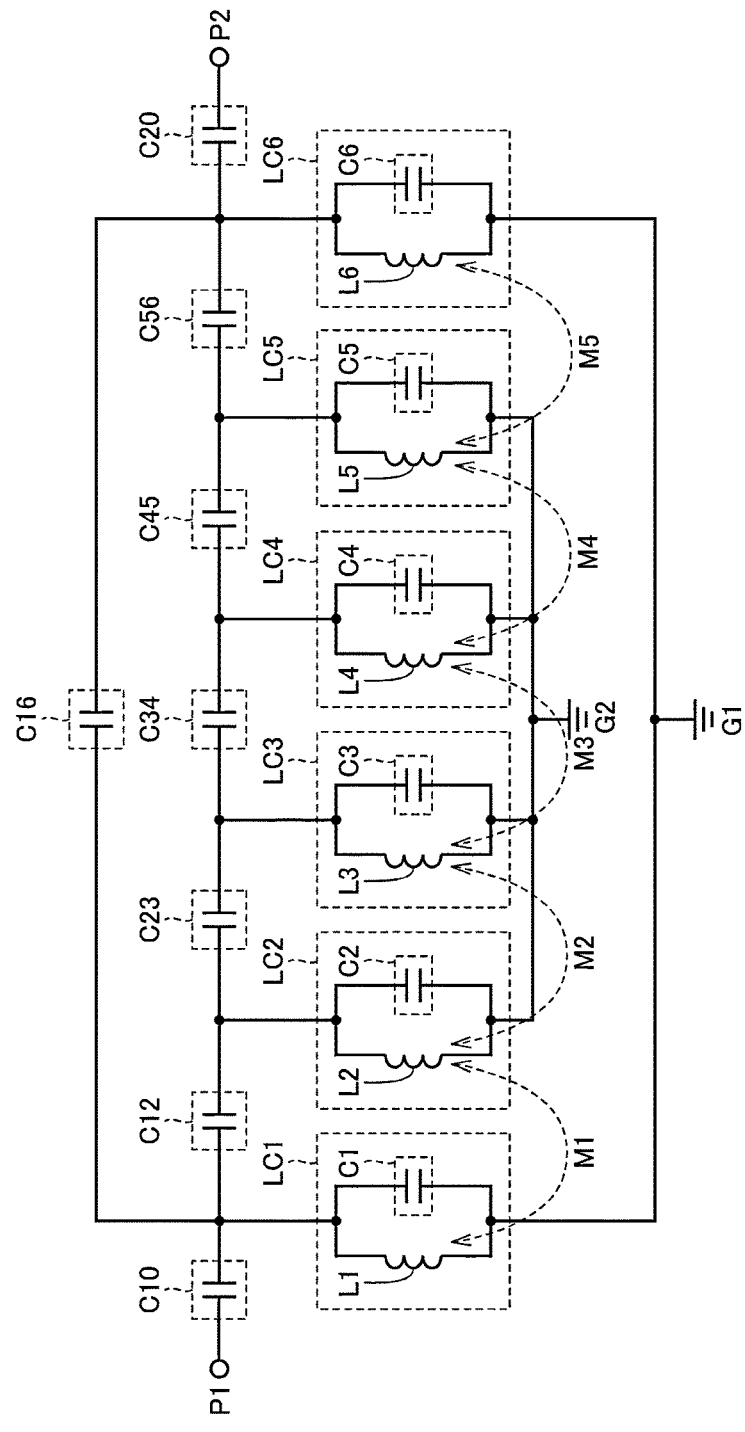
FIG. 17 is an equivalent circuit diagram of a multilayer filter according to Preferred Embodiment 5 of the present invention.

FIG. 17 is an equivalent circuit diagram of a multilayer filter 5 according to Preferred Embodiment 5 of the present invention. An equivalent circuit of the multilayer filter 5 is an equivalent circuit obtained by adding an LC parallel resonator LC6 (third LC resonator) to the LC parallel resonators LC1 to LC5 included in the multilayer filter 4 in FIG. 15. Configurations other than changes based on the addition of the LC parallel resonator LC6 are the same as or similar to those in the multilayer filter 4 in FIG. 15, and thus a repeated description thereof is not provided.

As illustrated in FIG. 17, magnetic field coupling M5 denotes magnetic field coupling between the LC parallel resonators LC5 and LC6. The LC parallel resonator LC6 is connected to the LC parallel resonator LC5 (fourth LC resonator) via a capacitor C56. The LC parallel resonator LC6 is connected to the LC parallel resonator LC1 via a capacitor C16. The LC parallel resonator LC6 is connected to the input/output terminal P2 via the capacitor C20. The LC parallel resonator LC6 is connected to the ground point G1. The LC parallel resonator LC5 is connected to the ground point G2.

The LC parallel resonator LC6 includes an inductor L6 and a capacitor C6. The inductor L6 and the capacitor C6 are connected in parallel between the ground point G1 and a connection point between the capacitors C56 and C20.

Figure 18:
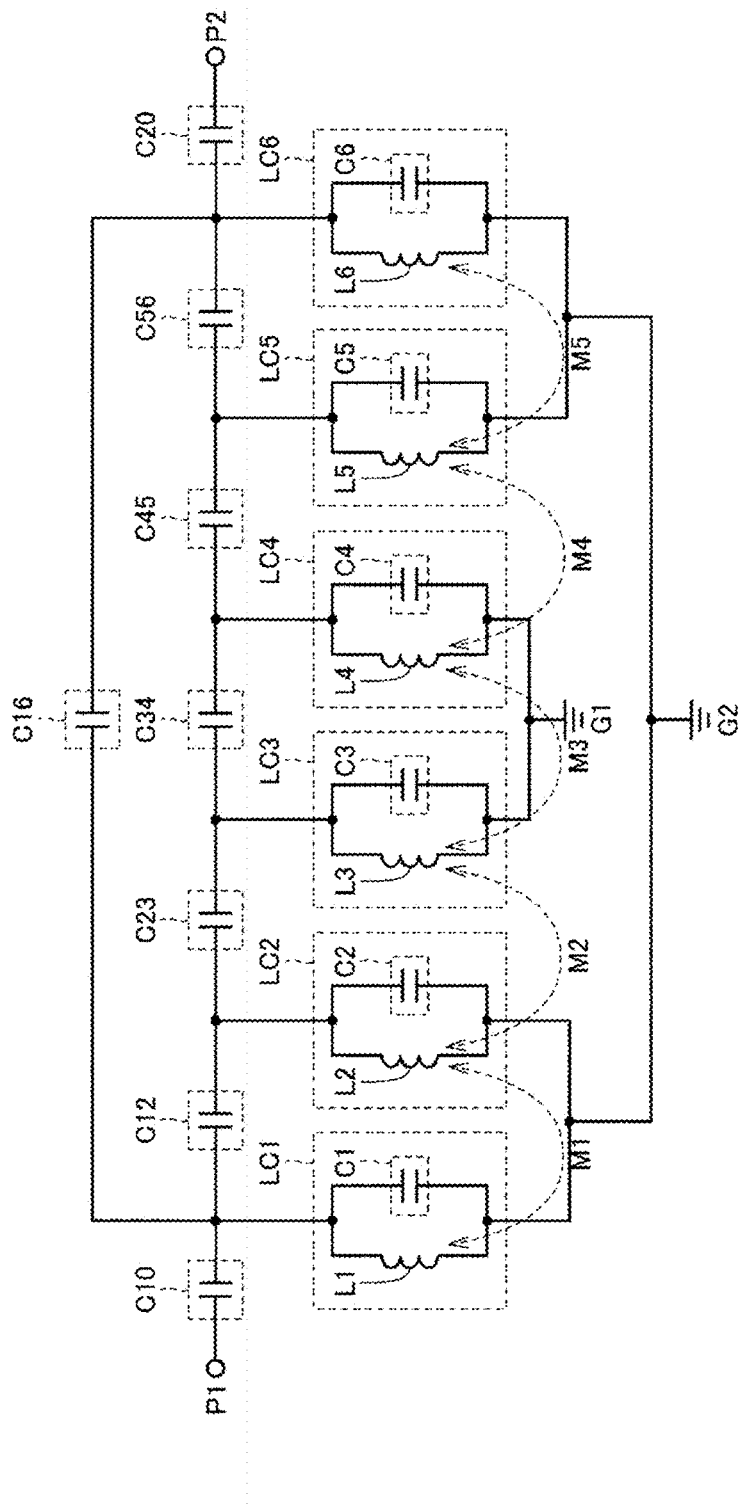
FIG. 18 is an equivalent circuit diagram of a multilayer filter according to a modification of Preferred Embodiment 5 of the present invention.

FIG. 18 is an equivalent circuit diagram of a multilayer filter 5A according to a modification of Preferred Embodiment 5. An equivalent circuit of the multilayer filter 5A is an equivalent circuit obtained by changing the ground point to which each of the LC parallel resonators LC1 and LC6 in FIG. 17 is connected from G1 to G2 and also changing the ground point to which each of the LC parallel resonators LC3 and LC4 is connected from G2 to G1. Configurations other than these are the same as or similar to those in FIG. 17, and thus a repeated description thereof is not given.

Thus, the multilayer filters according to Preferred Embodiment 5 and the modification enable an improvement in attenuation characteristics.

Preferred Embodiment 6

Figure 19:
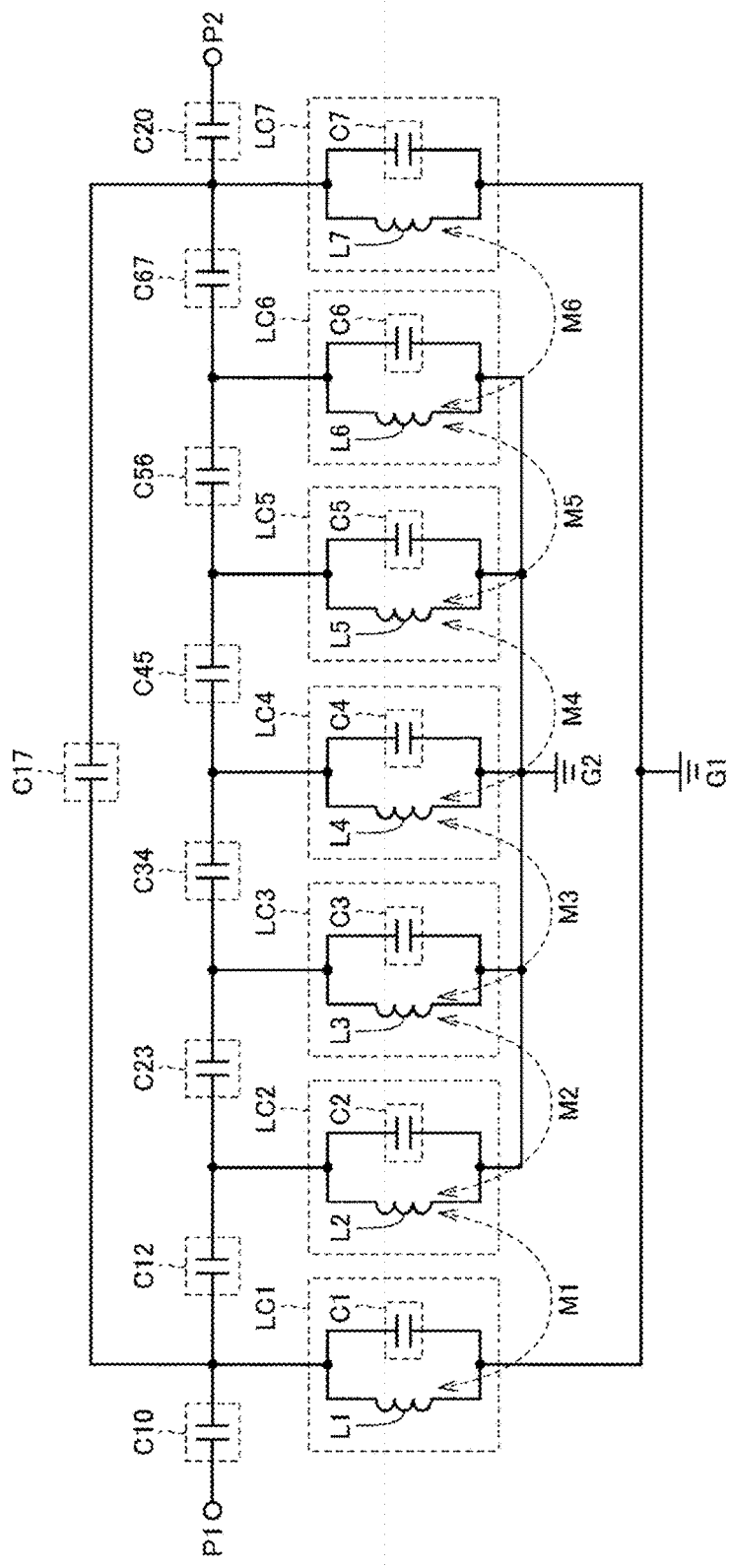
FIG. 19 is an equivalent circuit diagram of a multilayer filter according to Preferred Embodiment 6 of the present invention.

FIG. 19 is an equivalent circuit diagram of a multilayer filter 6 according to Preferred Embodiment 6 of the present invention. An equivalent circuit of the multilayer filter 6 is an equivalent circuit obtained by adding an LC parallel resonator LC7 (third LC resonator) to the LC parallel resonators LC1 to LC6 included in the multilayer filter 5 in FIG. 17. Configurations other than changes based on the addition of the LC parallel resonator LC7 are the same as or similar to those in the multilayer filter 5 in FIG. 17, and thus a repeated description thereof is not provided.

As illustrated in FIG. 19, magnetic field coupling M6 denotes magnetic field coupling between the LC parallel resonators LC6 and LC7. The LC parallel resonator LC7 is connected to the LC parallel resonator LC6 (fourth LC resonator) via a capacitor C67. The LC parallel resonator LC7 is connected to the LC parallel resonator LC1 via a capacitor C17. The LC parallel resonator LC7 is connected to the input/output terminal P2 via the capacitor C20. The LC parallel resonator LC7 is connected to the ground point G1. The LC parallel resonator LC6 is connected to the ground point G2.

The LC parallel resonator LC7 includes an inductor L7 and a capacitor C7. The inductor L7 and the capacitor C7 are connected in parallel between the ground point G1 and a connection point between the capacitors C67 and C20.

Figure 20:
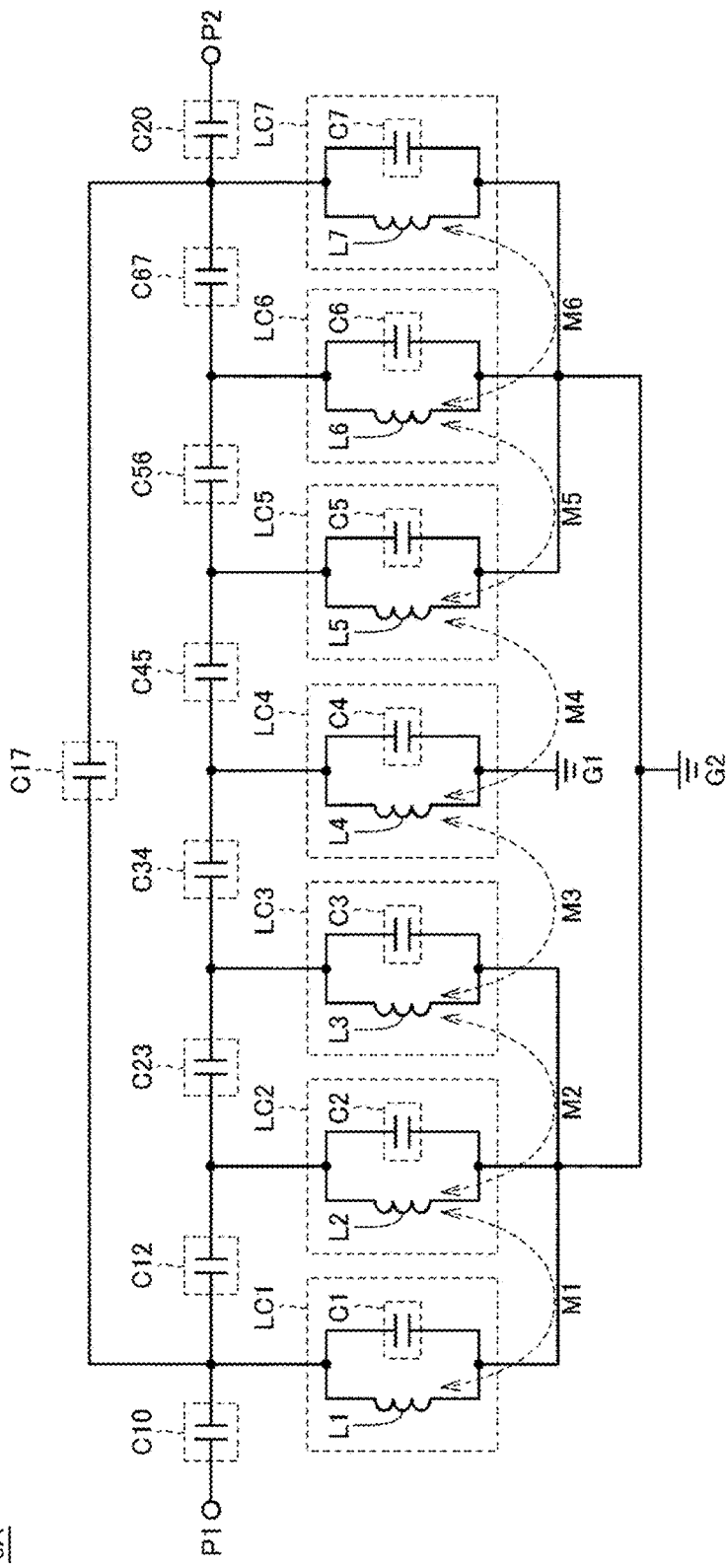
FIG. 20 is an equivalent circuit diagram of a multilayer filter according to a modification of Preferred Embodiment 6 of the present invention.

FIG. 20 is an equivalent circuit diagram of a multilayer filter 6A according to a modification of Preferred Embodiment 6. An equivalent circuit of the multilayer filter 6A is an equivalent circuit obtained by changing the ground point to which each of the LC parallel resonators LC1 and LC7 in FIG. 19 is connected from G1 to G2 and also changing the ground point to which the LC parallel resonator LC4 is connected from G2 to G1. Configurations other than these are the same as or similar to those in FIG. 19, and thus a repeated description thereof is not given.

Thus, the multilayer filters according to Preferred Embodiment 6 and the modification enable an improvement in attenuation characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer filter comprising:
   a first ground electrode and a second ground electrode;
   a first ground via conductor connecting the first ground electrode and the second ground electrode;
   a first LC resonator connected to the first ground electrode; and
   a second LC resonator connected to the second ground electrode; wherein
   the first LC resonator includes:
      a first line electrode;
      a first capacitor electrode between the first ground electrode and the first line electrode;
      a first via conductor connecting the first line electrode and the first capacitor electrode; and
      a second via conductor extending from the first line electrode to a first capacitor electrode side and connecting the first line electrode and the first ground electrode;
   the second LC resonator includes:
      a second line electrode;
      a second capacitor electrode between the second ground electrode and the second line electrode;
      a third via conductor connecting the second line electrode and the second capacitor electrode; and
      a fourth via conductor extending from the second line electrode to a second capacitor electrode side and connecting the second line electrode and the second ground electrode;
   each of the first line electrode and the second line electrode extends in a first direction; and
   when viewed in a plan view from a second direction orthogonal or substantially orthogonal to each of the first direction and a direction in which the first via conductor extends, in the first direction, the third via conductor is closer to the first via conductor than the second via conductor is, and, in the first direction, the fourth via conductor is closer to the second via conductor than the first via conductor is.

2. The multilayer filter according to claim 1, further comprising a multilayer body including a plurality of dielectric layers.

3. The multilayer filter according to claim 2, wherein the multilayer body has a rectangular or substantially rectangular parallelepiped shape.

4. The multilayer filter according to claim 1, wherein, when viewed in the plan view from the second direction, in the first direction, the first ground via conductor is closer to the first via conductor than the second via conductor is.

5. The multilayer filter according to claim 1, further comprising:
   a ground terminal; and
   a second ground via conductor connecting the ground terminal and the first ground electrode.

6. The multilayer filter according to claim 1, further comprising:
   a third LC resonator;
   a first terminal electrically connected to the first LC resonator; and
   a second terminal electrically connected to the third LC resonator; wherein
   the third LC resonator includes:
      a third line electrode;
      a third capacitor electrode between the first ground electrode and the third line electrode;
      a fifth via conductor connecting the third line electrode and the third capacitor electrode; and
      a sixth via conductor extending from the third line electrode to a third capacitor electrode side and connecting the third line electrode and the first ground electrode.

7. The multilayer filter according to claim 6, further comprising:
   a fourth LC resonator; wherein
   the fourth LC resonator includes:
      a fourth line electrode;
      a fourth capacitor electrode between the second ground electrode and the fourth line electrode;

a seventh via conductor connecting the fourth line electrode and the fourth capacitor electrode; and an eighth via conductor extending from the fourth line electrode to a fourth capacitor electrode side and connecting the fourth line electrode and the second ground electrode.

8. The multilayer filter according to claim 7, wherein the third and fourth LC resonators are coupled to each other by electromagnetic field coupling.

9. The multilayer filter according to claim 6, wherein the first capacitor electrode is disposed between the second ground electrode and the first line electrode; and the second capacitor electrode is disposed between the second ground electrode and the second line electrode.

10. The multilayer filter according to claim 9, further comprising:

a first coupling electrode connected to the first terminal between the first ground electrode and the second ground electrode and extending from the first terminal toward the second terminal;

a second coupling electrode connected to the second terminal between the first ground electrode and the second ground electrode and extending from the second terminal toward the first terminal;

a fifth capacitor electrode facing the first capacitor electrode and connected to the first terminal; and a sixth capacitor electrode facing the third capacitor electrode and connected to the second terminal; wherein in a direction from the first terminal towards the second terminal, the first coupling electrode faces the second coupling electrode.

11. The multilayer filter according to claim 9, wherein, in the direction in which the first via conductor extends, a distance between the first line electrode and the second ground electrode is shorter than a distance between the first line electrode and the first ground electrode.

12. The multilayer filter according to claim 6, wherein the second and third LC resonators are coupled to each other by electromagnetic field coupling.

13. The multilayer filter according to claim 1, further comprising a third coupling electrode facing each of the first capacitor electrode and the second capacitor electrode.

14. The multilayer filter according to claim 1, wherein the first and second LC resonators are coupled to each other by electromagnetic field coupling.

* * * * *